US010224313B2

(12) United States Patent
Gandhi (10) Patent No.: US 10,224,313 B2
(45) Date of Patent: Mar. 5, 2019

(54) INTERCONNECT STRUCTURES WITH INTERMETALLIC PALLADIUM JOINTS AND ASSOCIATED SYSTEMS AND METHODS

(71) Applicant: Micron Technology, Inc., Boise, ID (US)

(72) Inventor: Jaspreet S. Gandhi, Boise, ID (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 15/905,086

(22) Filed: Feb. 26, 2018

(65) Prior Publication Data

US 2018/0190620 A1     Jul. 5, 2018

Related U.S. Application Data

(60) Continuation of application No. 15/425,956, filed on Feb. 6, 2017, now Pat. No. 9,905,539, which is a
(Continued)

(51) Int. Cl.
*H01L 25/065*     (2006.01)
*H01L 23/00*     (2006.01)
(Continued)

(52) U.S. Cl.
CPC .......... *H01L 25/0657* (2013.01); *H01L 24/02* (2013.01); *H01L 24/13* (2013.01);
(Continued)

(58) Field of Classification Search
CPC ............ H01L 2224/07; H01L 2224/08; H01L 2224/08053; H01L 2224/08058;
(Continued)

(56) References Cited

U.S. PATENT DOCUMENTS 6,600,222 B1    7/2003   Levardo
2010/0127047 A1   5/2010   Ho et al.
(Continued)

OTHER PUBLICATIONS

WO2015/162872.*
(Continued)

*Primary Examiner* — Sonya D. McCall-Shepard
(74) *Attorney, Agent, or Firm* — Perkins Coie LLP (57) ABSTRACT

Interconnect structures with intermetallic palladium joints are disclosed herein. In one embodiment, a method of forming an interconnect structure includes depositing a first conductive material comprising nickel on a first conductive surface of a first die, and depositing a second conductive material comprising nickel on a second conductive surface of a second die spaced apart from the first surface. The method further includes depositing a third conductive material on the second conductive material, and thermally compressing tin/solder between the first and third conductive materials to form an intermetallic palladium joint that extends between the first conductive material and the second conductive material such that one end of the intermetallic palladium joint is bonded directly to the first conductive material and an opposite end of the intermetallic palladium joint is bonded directly to the second conductive material.

14 Claims, 10 Drawing Sheets

Related U.S. Application Data division of application No. 14/509,912, filed on Oct. 8, 2014, now Pat. No. 9,564,418.

(51) Int. Cl.
*H01L 25/18* (2006.01)
*H01L 25/00* (2006.01)

(52) U.S. Cl.
CPC .............. *H01L 24/14* (2013.01); *H01L 24/16* (2013.01); *H01L 24/17* (2013.01); *H01L 24/81* (2013.01); *H01L 25/18* (2013.01); *H01L 25/50* (2013.01); *H01L 24/05* (2013.01); *H01L 24/11* (2013.01); *H01L 2224/02372* (2013.01); *H01L 2224/0401* (2013.01); *H01L 2224/05025* (2013.01); *H01L 2224/05548* (2013.01); *H01L 2224/05567* (2013.01); *H01L 2224/05582* (2013.01); *H01L 2224/05664* (2013.01); *H01L 2224/06181* (2013.01); *H01L 2224/11334* (2013.01); *H01L 2224/11462* (2013.01); *H01L 2224/11464* (2013.01); *H01L 2224/13022* (2013.01); *H01L 2224/13024* (2013.01); *H01L 2224/13025* (2013.01); *H01L 2224/13083* (2013.01); *H01L 2224/13111* (2013.01); *H01L 2224/13147* (2013.01); *H01L 2224/13155* (2013.01); *H01L 2224/13541* (2013.01); *H01L 2224/13564* (2013.01); *H01L 2224/13582* (2013.01); *H01L 2224/13611* (2013.01); *H01L 2224/13655* (2013.01); *H01L 2224/13664* (2013.01); *H01L 2224/1403* (2013.01); *H01L 2224/14181* (2013.01); *H01L 2224/16058* (2013.01); *H01L 2224/16145* (2013.01); *H01L 2224/16146* (2013.01); *H01L 2224/16148* (2013.01); *H01L 2224/16227* (2013.01); *H01L 2224/16503* (2013.01); *H01L 2224/17181* (2013.01); *H01L 2224/32145* (2013.01); *H01L 2224/73204* (2013.01); *H01L 2224/8181* (2013.01); *H01L 2224/81191* (2013.01); *H01L 2224/81203* (2013.01); *H01L 2224/81801* (2013.01); *H01L 2225/06513* (2013.01); *H01L 2225/06517* (2013.01); *H01L 2225/06524* (2013.01); *H01L 2225/06541* (2013.01); *H01L 2924/014* (2013.01); *H01L 2924/0105* (2013.01); *H01L 2924/01029* (2013.01); *H01L 2924/01047* (2013.01); *H01L 2924/01327* (2013.01); *H01L 2924/1431* (2013.01); *H01L 2924/1434* (2013.01); *H01L 2924/1436* (2013.01); *H01L 2924/3512* (2013.01)

(58) Field of Classification Search
CPC ... H01L 2224/0807; H01L 2224/08123; H01L 2224/08501; H01L 2224/08503; H01L 2224/05; H01L 2224/05075; H01L 2224/0508; H01L 2224/05164; H01L 2224/05073; H01L 2224/05082; H01L 2224/01

See application file for complete search history.

(56) References Cited

U.S. PATENT DOCUMENTS

| | | |
|---|---|---|
| 2012/0199981 A1 | 8/2012 | Jeong et al. |
| 2013/0285248 A1 | 10/2013 | Yin et al. |
| 2014/0131898 A1 | 5/2014 | Shearer et al. |
| 2015/0255414 A1* | 9/2015 | Liu .................. H01L 24/16 257/737 |

OTHER PUBLICATIONS

Gupta, P., "Effect of Inter metallic Compounds on Therrnornechanical Reliability of Lead-Free Solder Interconnects for Flip-Chips", Thesis, Georgia Institute of Technology, Aug. 2004, 100 pages, <URL: http://hdl.handle.net/1853/4800>.

* cited by examiner

INTERCONNECT STRUCTURES WITH INTERMETALLIC PALLADIUM JOINTS AND ASSOCIATED SYSTEMS AND METHODS

CROSS-REFERENCE TO RELATED APPLICATION

This application is a continuation of U.S. application Ser. No. 15/425,956, filed Feb. 6, 2017, which is a divisional of U.S. application Ser. No. 14/509,912, filed Oct. 8, 2014, now U.S. Pat. No. 9,564,418, each of which is incorporated herein by reference in its entirety.

TECHNICAL FIELD

The disclosed embodiments relate to interconnect structures in semiconductor devices. In several embodiments, the present technology relates to interconnect structures with conductive joints, such as metal solder joints.

BACKGROUND

Packaged semiconductor dies, including memory chips, microprocessor chips, and imager chips, typically include a semiconductor die mounted on a substrate and encased in a plastic protective covering. The die includes functional features, such as memory cells, processor circuits, and imager devices, as well as bond pads electrically connected to the functional features. The bond pads can be electrically connected to terminals outside the protective covering to allow the die to be connected to higher level circuitry. Within some packages, semiconductor dies can be stacked upon and electrically connected to one another by individual interconnects placed between adjacent dies. In such packages, each interconnect can include a conductive material (e.g., solder) and a pair of contacts on opposing surfaces of adjacent dies. For example, a metal solder can be placed between the contacts and then reflowed so that it reacts with the metal at each of the contacts to form a conductive joint.

One challenge with traditional solder joints is that solder can migrate or spread during reflow. For example, the solder can be displaced when it is squeezed between the metal contacts. Also, certain forces, such as surface tension, can cause the solder to wick away from a conductive surface and onto other surfaces. One specific challenge occurs when the solder wicks onto and forms an intermetallic material on the sidewalls of a metal contact. Such intermetallic materials on the sidewalls can ultimately degrade the overall electrical and/or thermal conductively of the contact. For example, conventional tin/copper intermetallic materials can reduce the overall thermal conductivity of a copper-based contact. Further, in vertical interconnects (e.g., copper posts), the solder can consume a substantial amount of metal, which can cause the interconnect to slump and/or form voids in the sidewalls (e.g., due to Kirkendall voiding).

DETAILED DESCRIPTION

Specific details of several embodiments of semiconductor device interconnect structures having intermetallic palladium joints and associated systems and methods are described below. The terms "semiconductor device" and "semiconductor die" generally refer to a solid-state device that includes semiconductor material, such as a logic device, memory device, or other semiconductor circuit, component, etc. Also, the terms "semiconductor device" and "semiconductor die" can refer to a finished device or to an assembly or other structure at various stages of processing before becoming a finished device. Depending upon the context in which it is used, the term "substrate" can refer to a wafer-level substrate or to a singulated, die-level substrate. A person skilled in the relevant art will recognize that suitable steps of the methods described herein can be performed at the wafer level or at the die level. Furthermore, unless the context indicates otherwise, structures disclosed herein can be formed using conventional semiconductor-manufacturing techniques. Materials can be deposited, for example, using chemical vapor deposition, physical vapor deposition, atomic layer deposition, spin coating, and/or other suitable techniques. Similarly, materials can be removed, for example, using plasma etching, wet etching, chemical-mechanical planarization, or other suitable techniques. A person skilled in the relevant art will also understand that the technology may have additional embodiments, and that the technology may be practiced without several of the details of the embodiments described below with reference to FIGS. 1A-5.

As used herein, the terms "vertical," "lateral," "upper," and "lower" can refer to relative directions or positions of features in the semiconductor device in view of the orientation shown in the Figures. For example, "upper" or "uppermost" can refer to a feature positioned closer to the top of a page than another feature. These terms, however, should be construed broadly to include semiconductor devices having other orientations, such as inverted or inclined orientations where top/bottom, over/under, above/below, up/down, and left/right can be interchanged depending on the orientation.

Figure 1:
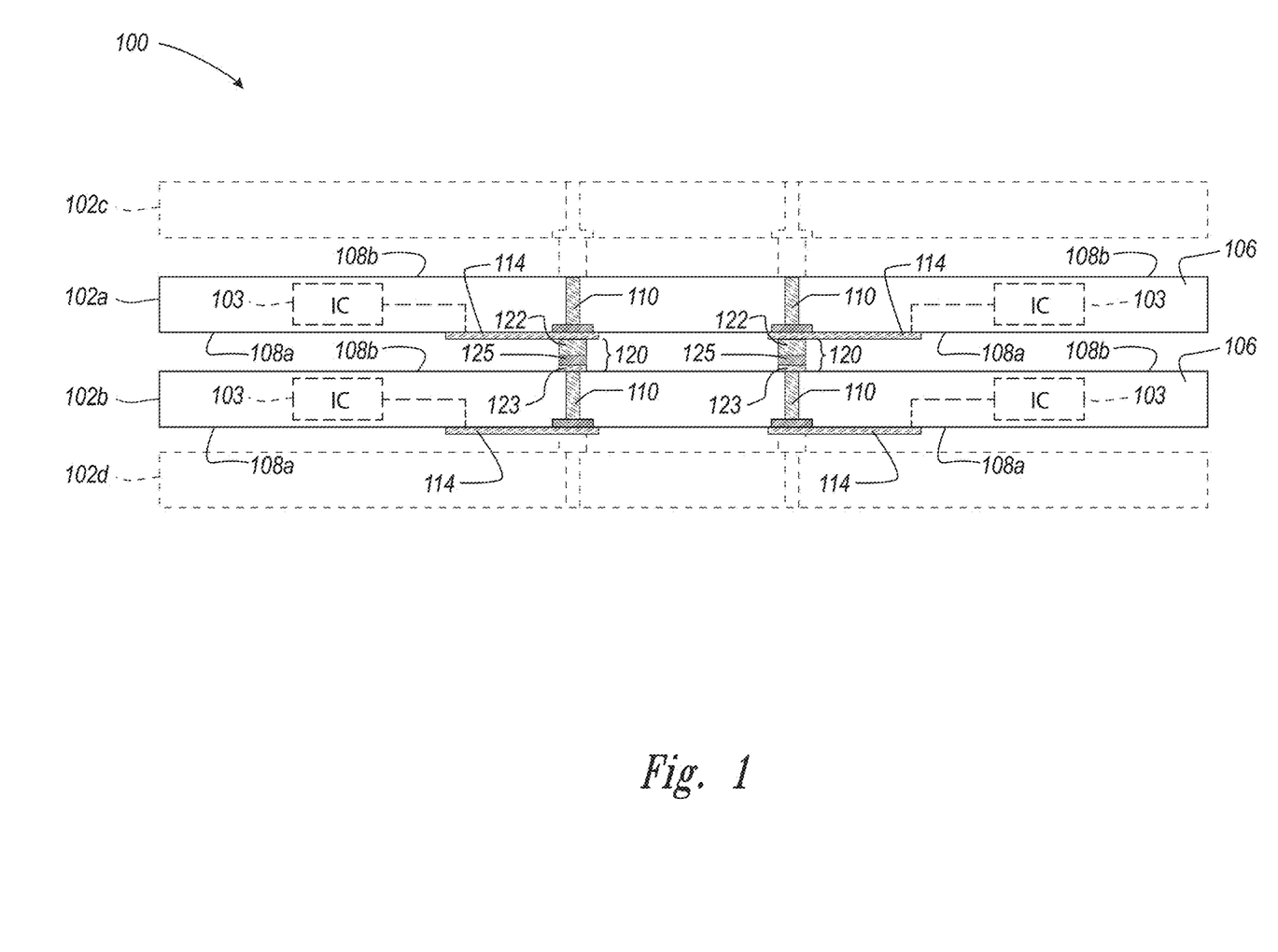
FIG. 1 is a cross-sectional view of a semiconductor device having interconnect structures in accordance with an embodiment of the present technology.

FIG. 1 is a cross-sectional view of a semiconductor device 100 having interconnect structures 120 in accordance with an embodiment of the present technology. As shown, the semiconductor device 100 includes a first semiconductor die 102a and a second semiconductor die 102b (collectively "semiconductor dies 102") adjacent to the first die 102a. In the illustrated embodiment of FIG. 1, the semiconductor device 100 includes two semiconductor dies, although in practice the semiconductor device 100 can include a different number of semiconductor dies, such as three dies, four dies, eight dies, sixteen dies, or more. For example, in another embodiment, the semiconductor device can include a third semiconductor die 102c (shown in hidden lines) on the first die 102a, and a fourth semiconductor die 102d (shown in hidden lines) on the second die 102b. Each of the semiconductor dies 102 includes integrated circuity 103, a substrate 106 (e.g., a silicon substrate), and through-substrate vias (TSVs) 110 extending through the substrate 106 from a first side 108a to a second side 108b. The integrated circuity 103 can include, for example, a memory circuit (e.g., a dynamic random memory (DRAM)), a controller circuit (e.g., a DRAM controller), a logic circuit, and/or other circuits. In at least some embodiments, the semiconductor device 100 can include other structures and features such as a casing (e.g., a thermally conductive casing) that encloses the semiconductor dies 102 within an enclosure; an interposer, a printed circuit board, and/or another substrate carrying the semiconductor dies 102; and/or an underfill material deposited or otherwise formed around and/or between the dies.

As further shown in FIG. 1, the interconnect structures 120 are disposed between the semiconductor dies 102. Each of the interconnect structures 120 includes a first conductive element 122, a second conductive element 123, and a conductive joint 125 coupling the first conductive element 122 to the second conductive element 123. The individual second conductive elements 123 are coupled to corresponding TSVs 110 at the second side 108b of the second die 102b, and the individual first conductive elements 122 are coupled to corresponding conductive traces 114 (e.g., copper traces) on the first side 108a of the first die 102a. The conductive traces 114, in turn, couple the individual TSVs 110 to the integrated circuity 103 of the semiconductor dies 102. In additional or alternate embodiments, the interconnect structures 120 can be directly coupled to other types of conductive elements, such as substrate pads or metal bumps. In practice, the semiconductor device 100 can include a greater number of interconnect structures than shown in the illustrated embodiments. For example, the semiconductor device can include four, eight, sixteen, fifty, a hundred, or more interconnect structures disposed between each of the dies.

Figure 2:
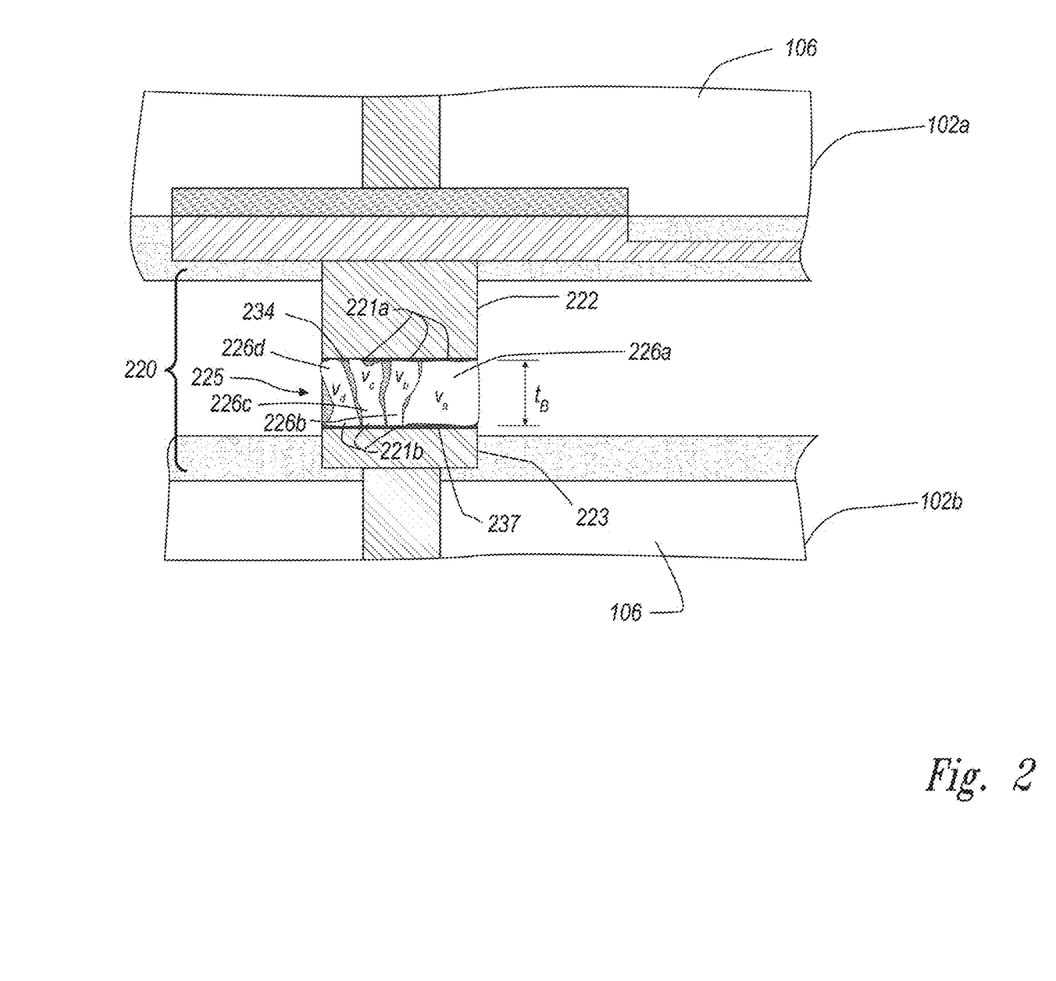
FIG. 2 is an enlarged cross-sectional view showing an individual interconnect structure in accordance with an embodiment of the present technology.

FIG. 2 is an enlarged cross-sectional view showing an individual interconnect structure 220 in accordance with an embodiment of the present technology. As shown, the interconnect structure 220 includes a first conductive element, or conductive pillar 222 (e.g., a copper pillar), and a second conductive element, or bond pad 223 (e.g., a copper pad), coupled to the conductive pillar 222 by an intermetallic palladium joint 225 ("intermetallic joint 225"). In the illustrated embodiment of FIG. 2, the intermetallic joint 225 defines a bond line thickness $t_B$ between the conductive pillar 222 and the bond pad 223. In the illustrated embodiment of FIG. 2, the intermetallic joint 225 includes a plurality of intermetallic features 226a-d (e.g., crystallites) that each have a first end portion 221 directly bonded to a first barrier material 234 (e.g., a nickel-based material) on the conductive pillar 222, and they also have a second end portion directly bonded to a second barrier material 237 (e.g., a nickel-based material) on the bond pad 223. In the example shown in FIG. 2 the first and second end portions 221a-b define the bond line thickness $t_B$ of the joint 225. In at least some embodiments, the bond line thickness $t_B$ can be in a range of from about 5 μm to 10 μm (e.g., about 7 μm). As described in greater detail below, the intermetallic features 226a-d have corresponding volumes Va-Vd, respectively, that are each composed of palladium and/or a palladium intermetallic material.

One challenge with conventional solder joints is that they can break (e.g. crack) depending on the relative concentration of the conductive materials within the joint. For example, a large concentration of unreacted metal solder can cause the joint to be too ductile, while a large concentration of unreacted barrier material can cause the joint to be too brittle. Palladium has been regarded in the semiconductor device industry as a less favorable intermetallic material because conventional solder joints having significant concentrations of palladium or palladium intermetallic materials are prone to breakage. In contravention to this conventional understanding, however, it is believed that the palladium-based intermetallic features of the various embodiments of the present technology increase the bond strength of a conductive joint. In particular, it is believed that the palladium-based intermetallic features increase bond strength when they span the entire width of the joint. As described in greater detail below, it is also believed that reliable conductive joints can be formed by thermo-compression bonding using selected amounts of metal solder and palladium source material having as-deposited thicknesses that fall within selected ranges of thickness.

Figure 3A:
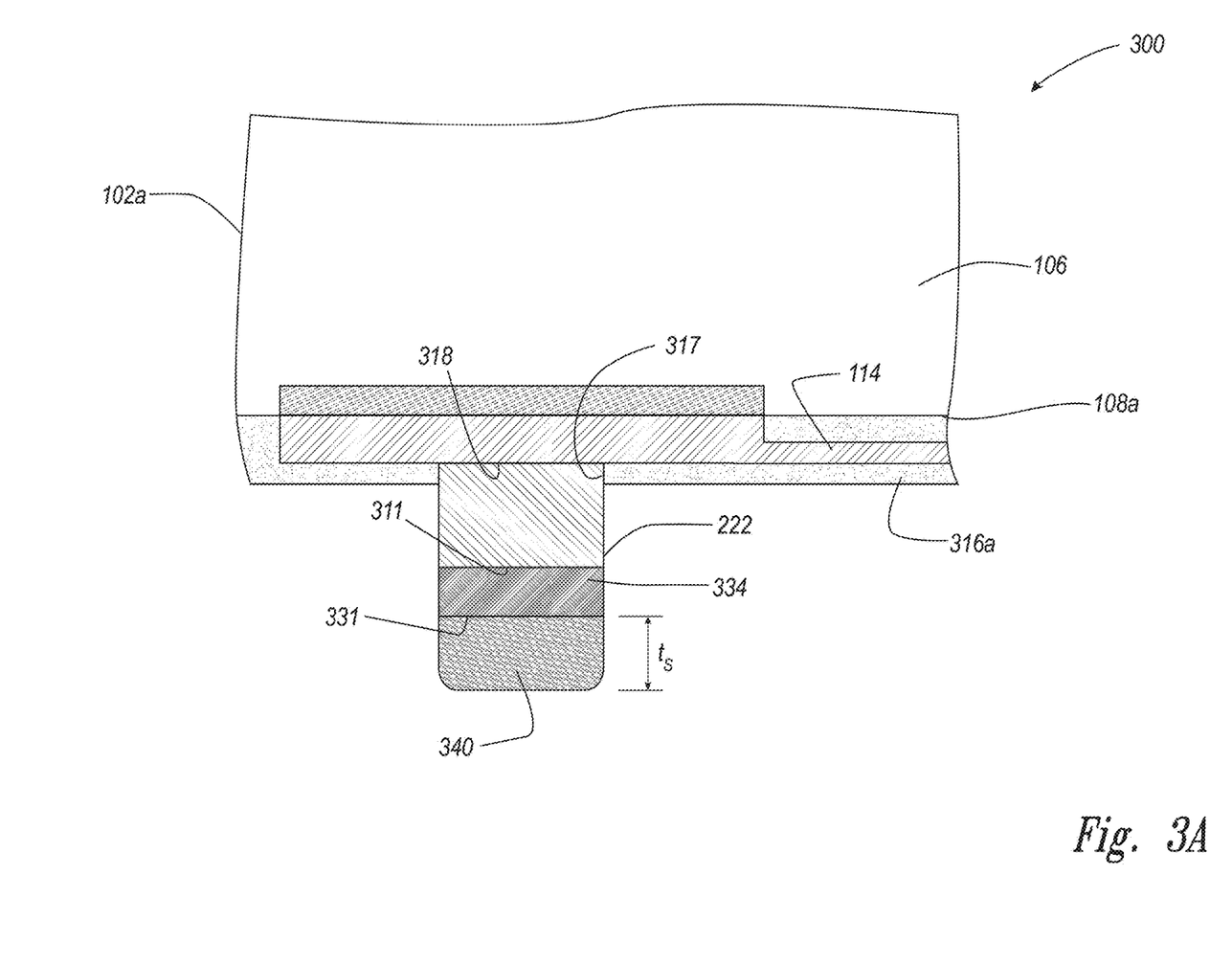
FIGS. 3A-3G are cross-sectional views illustrating a semiconductor device at various stages in a method for making interconnect structures or other connectors in accordance with selected embodiments of the present technology.

FIGS. 3A-3G are cross-sectional views illustrating a semiconductor device 300 at various stages in a method for making interconnect structures or other connectors in accordance with selected embodiments of the present technology. Referring first to FIG. 3A, semiconductor device 300 has a first dielectric material 316a (e.g., silicon oxide) on the first side 108a of the substrate 106, and the conductive trace 114 is buried within the first dielectric material 316a. The first dielectric material 316a has a patterned opening 317 that exposes a surface 318 of the buried conductive trace 114 within the opening 317. The conductive pillar 222 is located on the trace 114, a first conductive material 334 is located on a surface 311 of the conductive pillar 222, and a film of bond material 340 is located on a surface 331 of the first conductive material 334. The first conductive material 334 can comprise a barrier material such as nickel. The bond material 340 can comprise, for example, metal solder, such as tin/silver solder. In at least some embodiments, the conductive pillar 222, the first conductive material 334, and the bond material 340 can be plated in sequence onto the conductive trace 114 via electroplating and/or electroless plating. In other embodiments, however, materials can be deposited using other techniques. For example, in one embodiment, the bond material 340 can be disposed on the surface 331 of the first conductive material 334 in the form of a solder ball. In one aspect of this embodiment described in greater detail below, the bond material 340 can be selected to have a suitable bond material thickness $t_S$ that falls within a selected range to form suitable intermetallic features within the intermetallic joint 225 (FIG. 2).

Figure 3B:
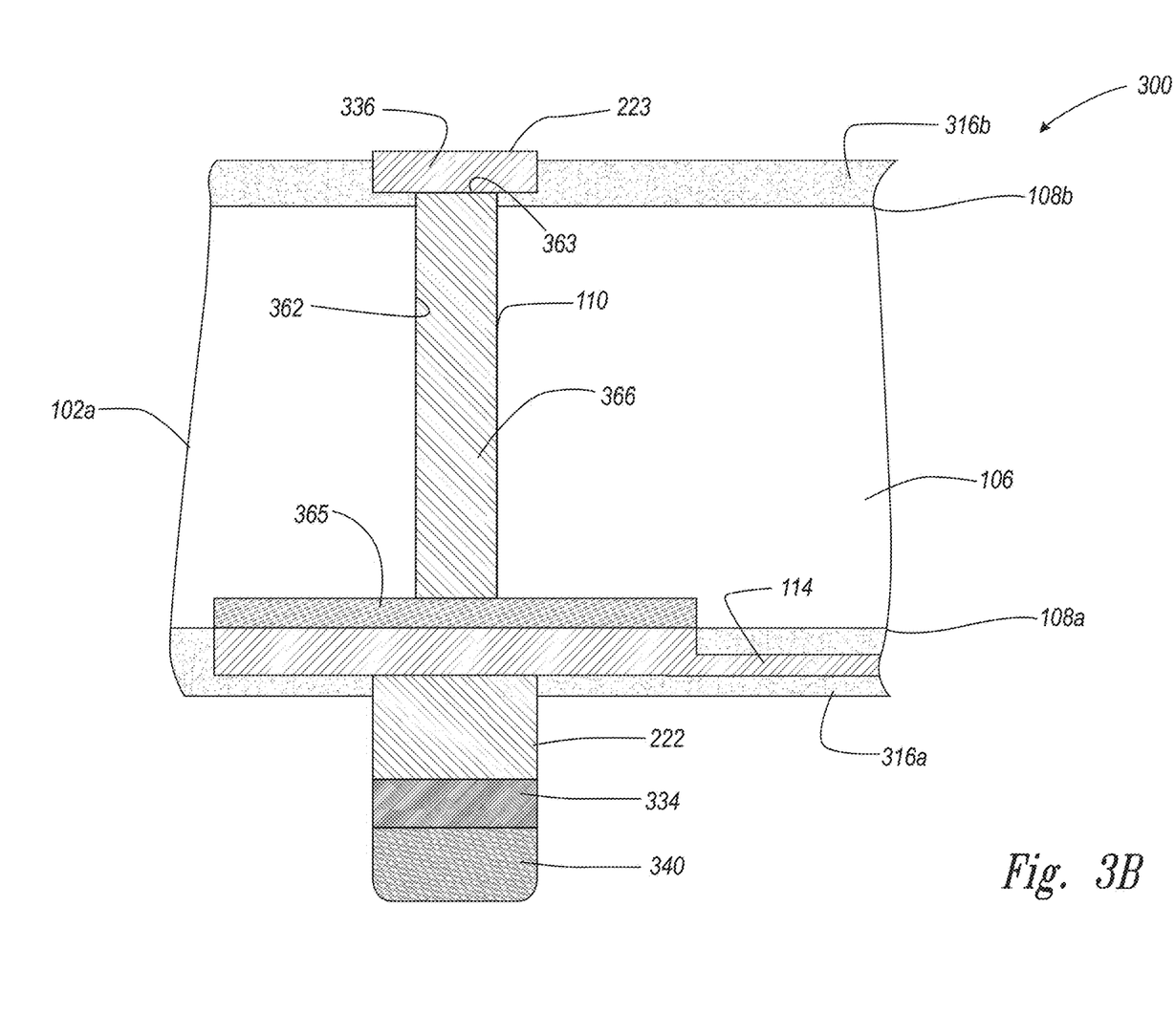

FIG. 3B shows the semiconductor device 300 after forming the bond pad 223 on a corresponding TSV 110 in the substrate 106 of the first semiconductor die 102a. The TSV 110 can be formed by first etching the substrate 106 at the second side 108b to form an opening 362 that extends from the second side 108b to a substrate pad 365 located at the base of the opening 362 and then filling the opening 362 with a conductive material 366 (e.g., copper or copper alloy). In an alternate embodiment, the TSVs 110 can be formed at a different processing stage such as before the processing stage shown in FIG. 3A (e.g., before front-end metallization). In at least some embodiments, the substrate 106 can be thinned before forming the individual TSVs 110. The bond pad 223 can be formed by depositing (e.g., plating) a conductive material 336 (e.g., copper) onto a surface 363 of the TSV 110. In the illustrated embodiment, the bond pad 223 can be electrically insulated from the substrate 106 by a second dielectric layer 316b formed between the bond pad 223 and the substrate 106 at the second side 108b.

Figure 3C:
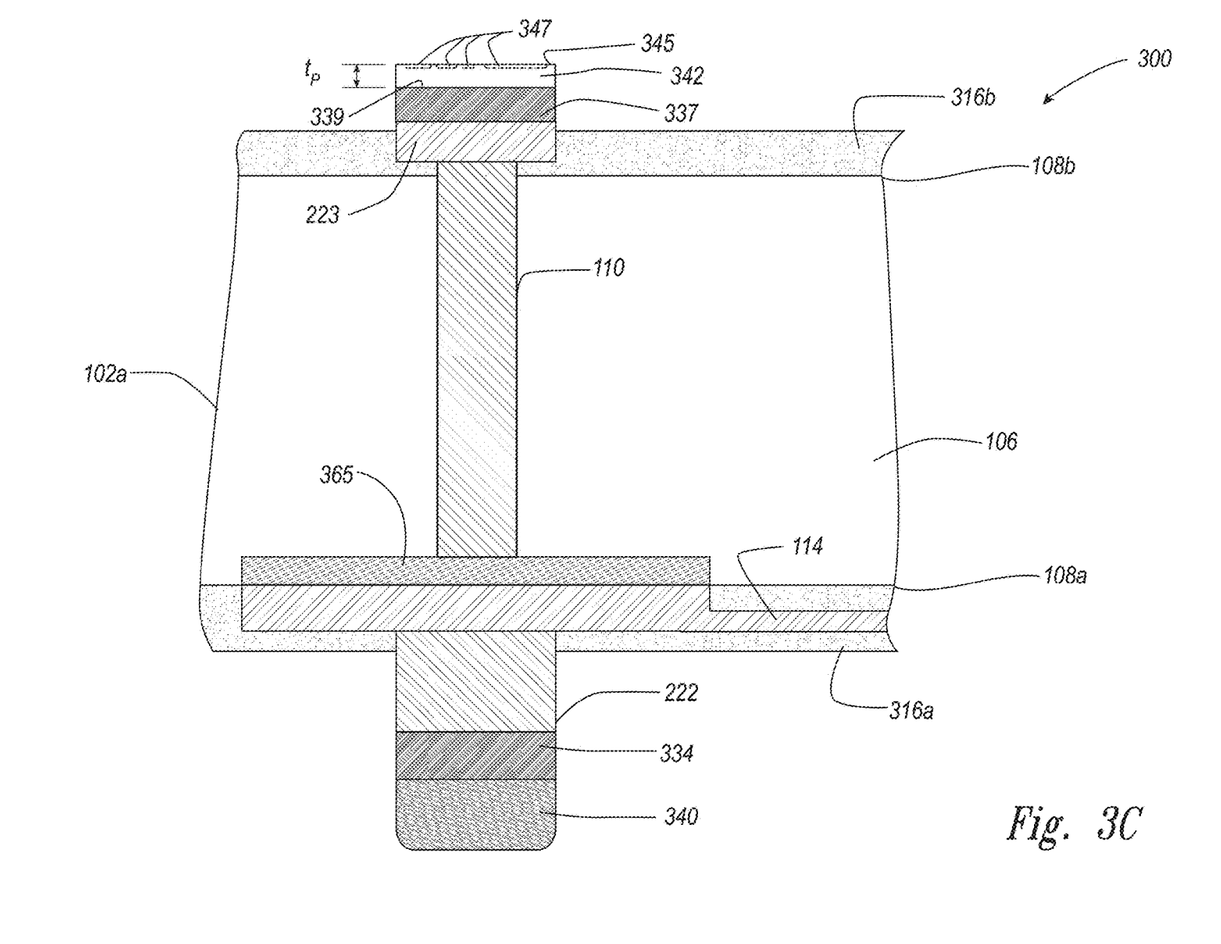

FIG. 3C shows the semiconductor device 300 after forming a second conductive material 337 on the bond pad 223 and a film of palladium material 342 on a surface 339 of the second conductive material 337. The second conductive material 337 can comprise a barrier material, such as nickel. In one embodiment, the second conductive material 337 and the palladium material 342 can be deposited in sequence onto the bond pad 223 (e.g., via electroplating and/or plating). As described in greater detail below, the palladium material 342 is formed to have a palladium thickness $t_P$ that falls within a selected range to form suitable intermetallic features within the intermetallic joint 225 (FIG. 2).

In at least some embodiments, the palladium material 342 can be formed to have a surface 345 containing a plurality of heterogeneous nucleation sites 347. The nucleation sites 347 can include, for example, topographical features, lattice discontinuities/orientations, surface defects, textures, and/or other surface features. As described in greater below, the nucleation sites can seed the growth of the intermetallic features during thermo-compression bonding. In additional or alternate embodiments, the second conductive material 337 can also be configured to have features (e.g., surface features, lattice discontinuities, etc.) that lead to the formation of suitable nucleation sites at the surface 345 and/or below the surface 345.

Figure 3D:
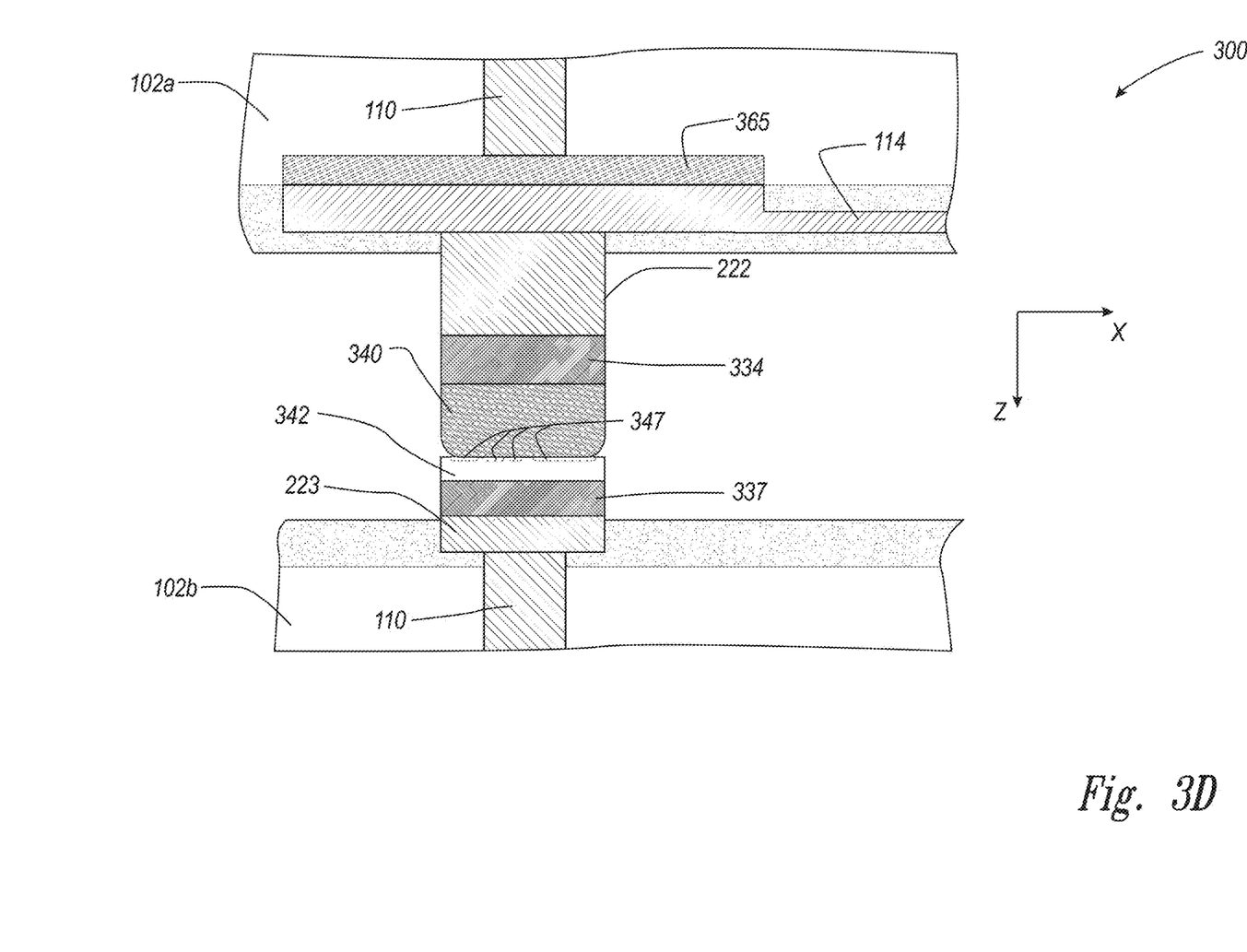
Figure 3E:
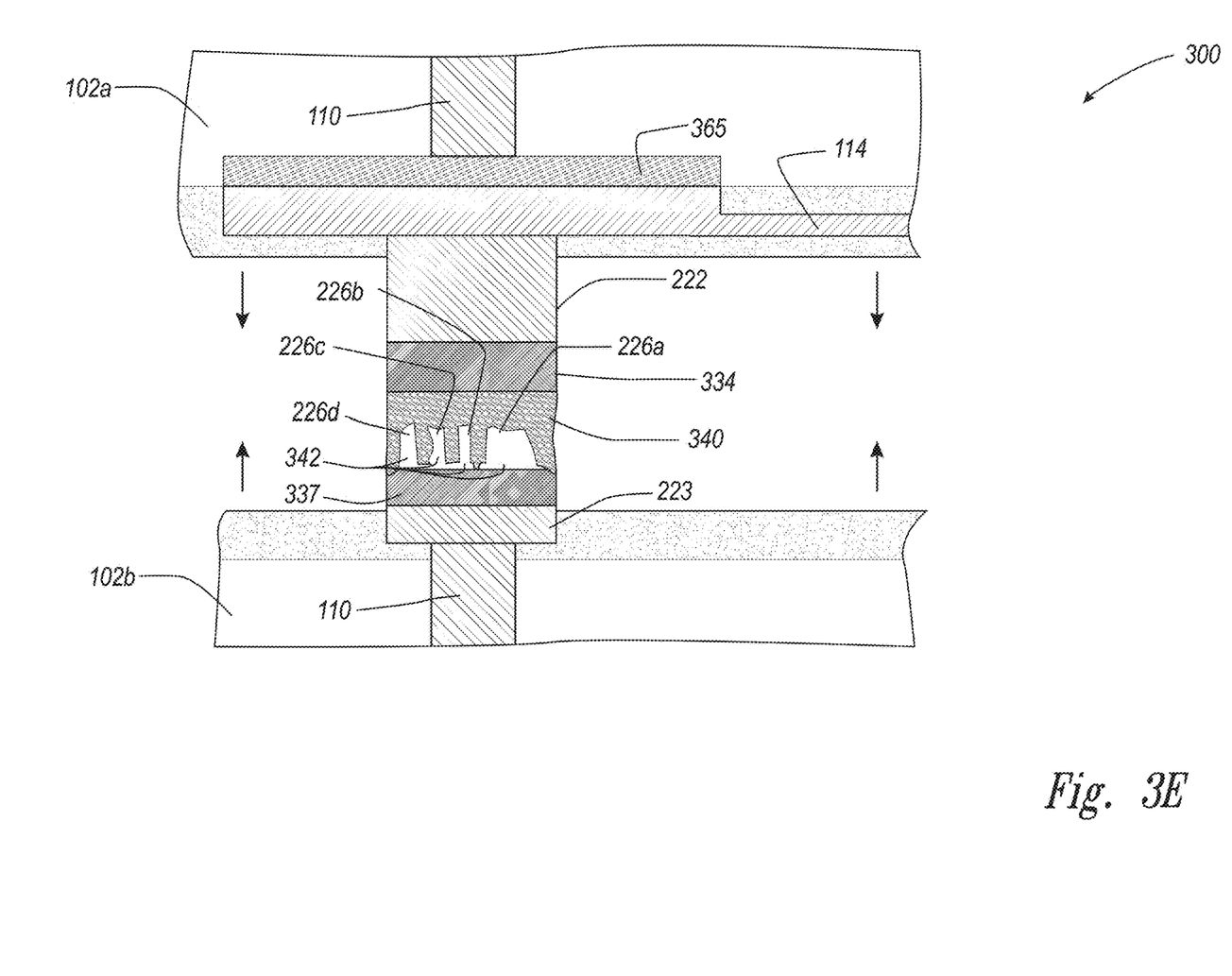
Figures 3F, 3G:
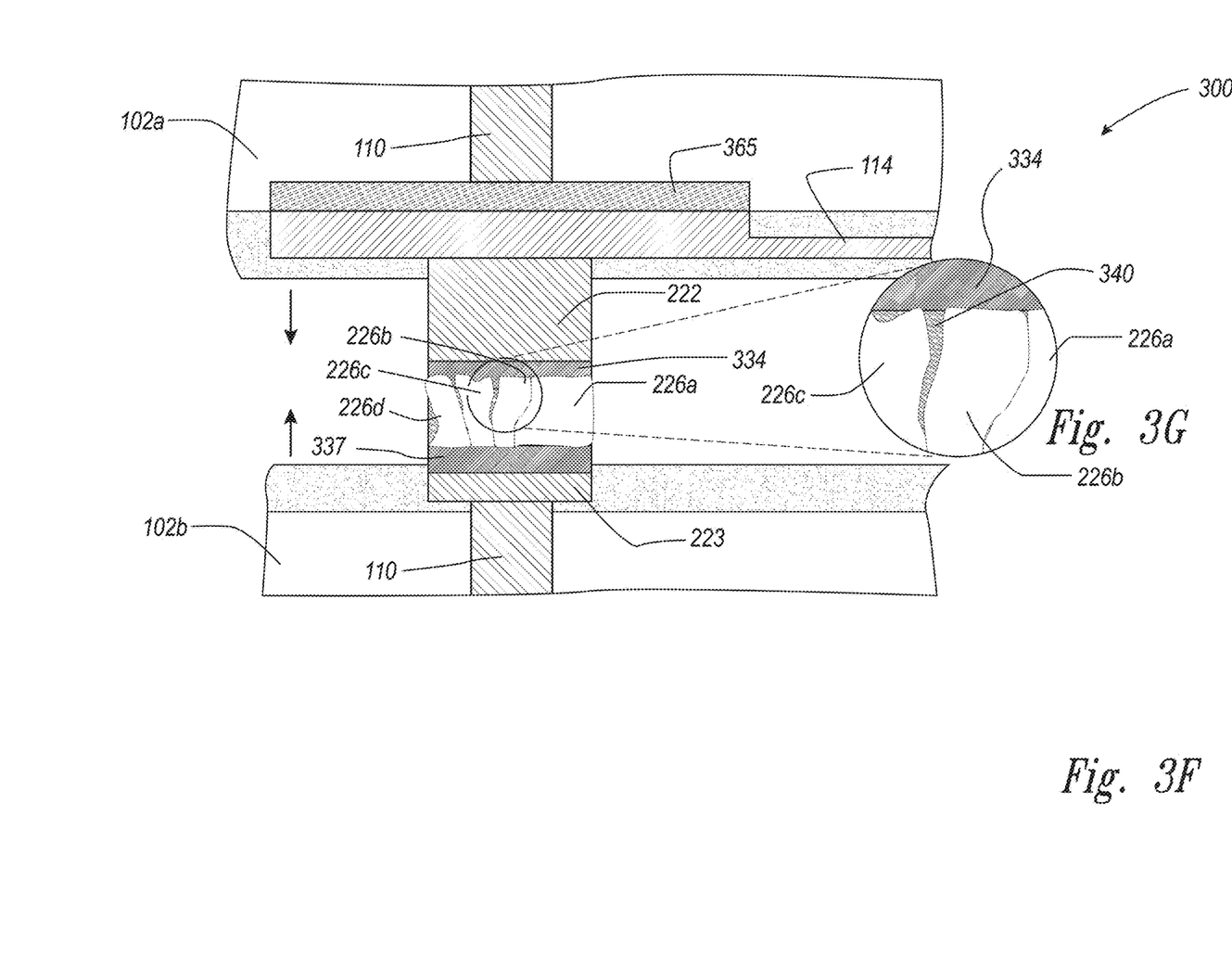

FIGS. 3D-3F show the semiconductor device 300 at selected stages of thermo-compression bonding. In general, thermo-compression bonding techniques use a combination of heat and compression (e.g., z-axis and/or vertical force control) to form a conductive solder joint between a pair of conductive materials. The combination of heat and compression of the solder between the conductive materials produces a bonding reaction that is relatively faster than the bonding reaction of traditional reflow techniques. For example, the overall processing time for a thermo-compression bonding process is typically on the order of 15-20 seconds. Another advantage of thermo-compression bonding is that metal solder is only allowed to flow for a limited amount of time before it cools and then hardens. As such, thermo-compression bonding can mitigate degradation that may otherwise occur due to migration of solder away from the joint and consumption of conductive material at the sidewalls of a conductive feature (e.g., at the sidewalls of a copper pillar).

FIG. 3D shows the semiconductor device 300 at an initial stage of thermo-compression bonding in which the bond material 340 has been heated and the semiconductor dies 102 have been brought into proximately with one another. As shown, the palladium material 340 is contacting the bond material 340. FIG. 3E shows a subsequent bonding stage in which the semiconductor dies 102 have been moved into closer proximity with one another relative to FIG. 3D. At the stage of FIG. 3E, the bond material 340 has partially reacted with both the palladium material 342 and the second conductive material 337, which has initiated the growth of the intermetallic features 226a-d at the nucleation sites 347 (FIG. 3D). As shown, the growth of the intermetallic features 226a-d is generally anisotropic (vertically in FIG. 3E). As discussed above, the nucleation sites 347 (FIG. 3D) can include various surface features (e.g., topographical features). It is believed that these surface features can be configured to influence the growth of the intermetallic features 226a-d and thereby achieve, e.g., a certain size, distribution, and/or orientation of the intermetallic features within an intermetallic joint.

FIG. 3F shows the semiconductor device 300 after the semiconductor dies 102 have been moved into closer proximity with one another relative to FIG. 3E. As shown, the intermetallic features 226a-d have grown further in the vertical direction and have reacted with the first conductive material 334 on the conductive pillar 222. In at least some embodiments, the first conductive material 334 and/or the second conductive material 337 can be fully converted into intermetallics during bonding thermo-compression bonding. Also, the bond material 340 can be fully converted into an intermetallic material during thermo-compression bonding or at a subsequent thermal processing stage (e.g., an annealing stage or another bonding stage). For example, referring to FIG. 3G, subsequent thermal processing can convert residual bond material 340 into an intermetallic material that defines the intermetallic features 226 a-d.

As discussed above, the intermetallic features 226a-d comprise palladium and/or an intermetallic palladium based material (e.g., palladium and nickel, palladium and tin, or palladium, nickel, and tin). As noted above, it is believed that suitable palladium-based intermetallic features can be formed using thermo-compression bonding in combination with selected amounts of metal solder and palladium source materials. For example, it is believed that reliable intermetallic features can be formed when the initial palladium thickness $t_P$ (FIG. 3C) is in a range of from about 0.1 μm to 0.3 μm (e.g., about 0.15 μm to 0.25 μm) and the initial bond material thickness $t_S$ (FIG. 3A) is in a range of from about 5 μm to 15 μm (e.g., 10 μm). It is also believed that suitable intermetallic features can be formed using other source materials in lieu of palladium. For example, it is believed that a noble metal, such as gold, may be used to form suitable gold-based intermetallic features.

Figure 4A:
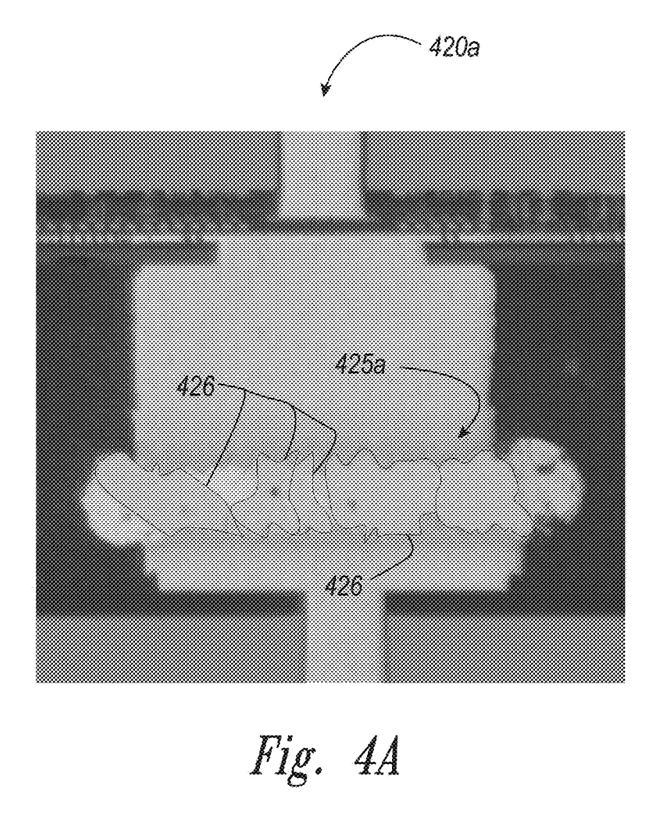
FIGS. 4A and 4B are illustrations showing interconnect structures having intermetallic palladium joints.
Figure 4B:
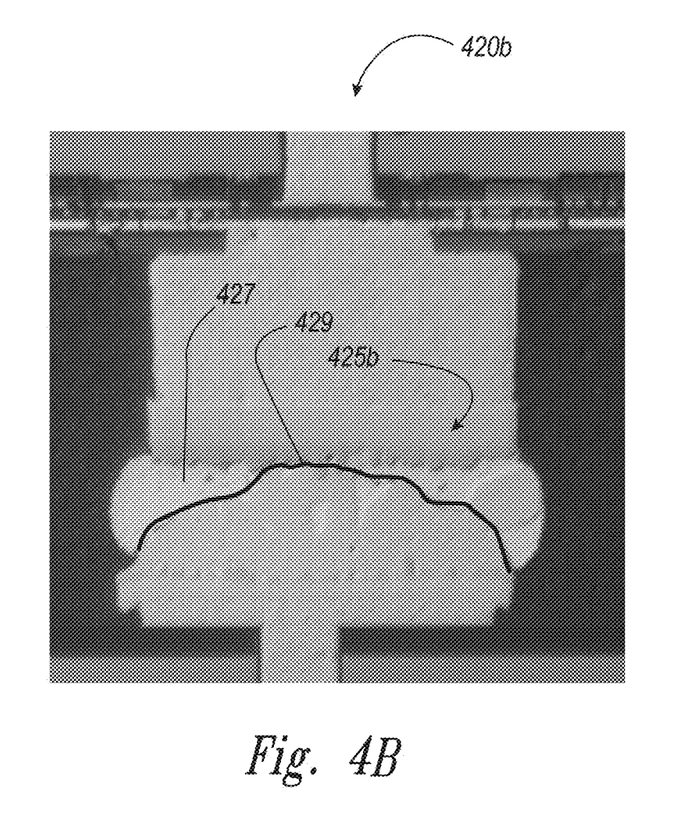

For purposes of comparison, FIGS. 4A and 4B show interconnect structures 420a and 420b, respectively, having palladium intermetallic joints 425a and 425b. In FIG. 4A, the intermetallic joint 425a was formed via thermo-compression bonding in accordance with the present technology using a tin/solder bond material having an initial bond material thickness $t_S$ (FIG. 3A) of 10 μm and a palladium source material having an initial palladium thickness $t_P$ (FIG. 3C) of 0.15 μm. The resulting intermetallic features 426 (enhanced for clarity) of the joint 425a in accordance with an embodiment of the present technology extend across the entire bond line thickness. In FIG. 4B, by contrast, the intermetallic joint 425b was formed via conventional thermo-compression bonding technology using a greater initial thickness of solder and palladium. As shown in FIG. 4B, the intermetallic joint 425b contains a large amount of unconverted bulk solder 427, and the intermetallic material of the joint 425b has failed to form a suitable bond between the conductive pillar and the bond pad. In particular, the joint contains a cracked region 429 (enhanced for clarity in FIG. 4B) such that the joint 425b is defective.

Figure 5:
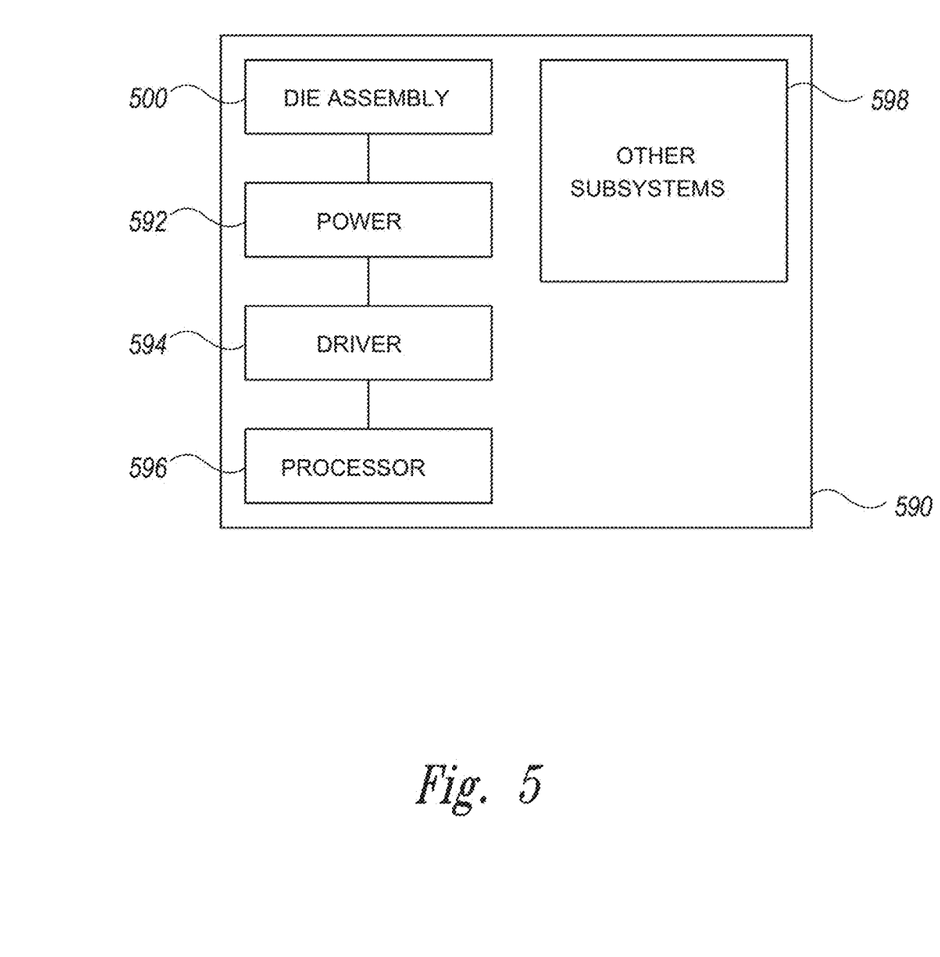
FIG. 5 is a schematic view of a system that includes a semiconductor device in accordance with embodiments of the present technology.

Any one of the interconnect structures and/or semiconductor devices described above with reference to FIGS. 1-4A can be incorporated into any of a myriad of larger and/or more complex systems, a representative example of which is system 590 shown schematically in FIG. 5. The system 590 can include a semiconductor device 500, a power source 592, a driver 594, a processor 596, and/or other subsystems or components 598. The semiconductor device 500 can include features generally similar to those of the semiconductor devices described above, and can therefore include various features that enhance heat dissipation. The resulting system 590 can perform any of a wide variety of functions such as memory storage, data processing, and/or other suitable functions. Accordingly, representative systems 590 can include, without limitation, hand-held devices (e.g., mobile phones, tablets, digital readers, and digital audio players), computers, vehicle and other machines and appliances. Components of the system 590 may be housed in a single unit or distributed over multiple, interconnected units (e.g., through a communications network). The components of the system 590 can also include remote devices and any of a wide variety of computer readable media.

From the foregoing, it will be appreciated that specific embodiments of the technology have been described herein for purposes of illustration but that various modifications may be made without deviating from the disclosure. Moreover, although advantages associated with certain embodiments of the new technology have been described in the context of those embodiments, other embodiments may also exhibit such advantages, and not all embodiments need necessarily exhibit such advantages to fall within the scope of the technology. Accordingly, the disclosure and associated technology can encompass other embodiments not expressly shown or described herein.

I claim:

1. A method of forming an interconnect structure, the method comprising:
providing a first conductive material on a first conductive surface of a first die;
providing a second conductive material on a second conductive surface of a second die, wherein the first conductive material and the second conductive material are the same;
providing a third conductive material on at least one of the first conductive material or the second conductive material; and
moving the first die toward the second die, thereby compressing a bond material positioned at least partially between the first and second conductive materials to form an intermetallic palladium joint that extends between the first conductive material and the second conductive material, wherein a first end of the intermetallic palladium joint is attached directly to the first conductive material and a second end of the intermetallic palladium joint is attached directly to the second conductive material.

2. The method of claim 1 wherein the first and second conductive materials both comprise nickel.

3. The method of claim 1 wherein the bond material comprises at least one of tin or solder, and wherein compressing the bond material comprises thermally compressing the bond material.

4. The method of claim 1 wherein the bond material is positioned at least partially between the first and third conductive materials.

5. The method of claim 1 wherein compressing the bond material comprises thermally compressing the bond material such that the bond material is being heated as the first die moves toward the second die.

6. A method of forming an interconnect structure, the method comprising:
providing a first conductive material on a first conductive surface of a first die;
providing a second conductive material on a second conductive surface of a second die, wherein the first conductive material and the second conductive material are the same;
providing a third conductive material on at least one of the first conductive material or the second conductive material; and
moving the first die toward the second die, thereby compressing a bond material positioned at least partially between the first and second conductive materials to form an intermetallic joint that extends between the first conductive material and the second conductive material, wherein the intermetallic joint includes a plurality of intermetallic features that extend across an entire bond line thickness, and wherein each of the intermetallic features comprises palladium.

7. A method of forming an interconnect structure, the method comprising:
providing a first conductive material on a first conductive surface of a first die;
providing a second conductive material on a second conductive surface of a second die, wherein the first conductive material and the second conductive material are the same;
providing a third conductive material on at least one of the first conductive material or the second conductive material, wherein providing the third conductive material comprises forming a first film of palladium having a thickness in a range between about 0.1 µm to 0.3 µm;
forming a bond material on the first conductive material to have a thickness in a range between about 5 µm to 15 µm, wherein the bond material is positioned at least partially between the first and second conductive materials; and
moving the first die toward the second die, thereby compressing the bond material to form an intermetallic joint that extends between the first conductive material and the second conductive material.

8. A method of forming an interconnect structure, the method comprising:
disposing a conductive film on a first die, wherein the conductive film includes a surface and a plurality of heterogeneous nucleation sites at the surface;
arranging the first die to face toward a second die such that the conductive film is between the first and second dies; and
growing a plurality of intermetallic features at the nucleation sites, wherein individual intermetallic features form a bond between the first and second dies.

9. The method of claim 8 wherein the conductive film includes palladium, and wherein the individual intermetallic features comprise a portion of the palladium.

10. The method of claim 8 wherein the conductive film includes a noble metal, and wherein each of the intermetallic features comprises a portion of the noble metal.

11. The method of claim 8 wherein:
the first die includes a first conductive element having a material;
the second die includes a second conductive element having the material;
the conductive film is disposed between the first and second conductive elements; and
the bond formed via the individual intermetallic features is formed between the first and second conductive elements.

12. The method of claim 8, further comprising disposing solder over the conductive film, wherein growing the plurality of intermetallic features includes simultaneously heating the solder and moving the first and second dies toward one another.

13. The method of claim 11 wherein the conductive film comprises palladium, and wherein the method further comprises:
disposing tin between the palladium and the first conductive element, wherein the individual intermetallic features comprise a portion of the palladium and a portion of the tin.

14. The method of claim 11 wherein the conductive film comprises palladium, and wherein the method further comprises:
   disposing solder between the palladium and the first conductive element, wherein the solder comprises tin; and
   disposing nickel between the solder and the first conductive element and/or between the palladium and the second conductive element,
   wherein each of the intermetallic features comprises a portion of the palladium, a portion of the tin, and a portion of the nickel.

* * * * *